United States Patent [19]

Owen

[11] Patent Number: 5,081,391
[45] Date of Patent: Jan. 14, 1992

[54] PIEZOELECTRIC CYLINDRICAL TRANSDUCER FOR PRODUCING OR DETECTING ASYMMETRICAL VIBRATIONS

[75] Inventor: Thomas E. Owen, Helotes, Tex.

[73] Assignee: Southwest Research Institute, San Antonio, Tex.

[21] Appl. No.: 406,797

[22] Filed: Sep. 13, 1989

[51] Int. Cl.$^5$ .............................................. H01L 41/08
[52] U.S. Cl. ....................................... 310/334; 310/328; 310/369; 310/337; 73/632; 73/151; 367/75; 367/912
[58] Field of Search ............... 310/334, 336, 337, 366, 310/369; 73/632, 151, 152; 367/75, 911, 912

[56] References Cited

U.S. PATENT DOCUMENTS

| | | | |
|---|---|---|---|
| 3,136,381 | 6/1964 | Anderson | 310/369 X |
| 4,446,544 | 5/1984 | Connolly, Jr. | 310/337 X |
| 4,525,645 | 6/1985 | Shirley | 310/337 |
| 4,672,592 | 6/1987 | Skinner | 310/337 X |
| 4,706,229 | 11/1987 | Congdon | 310/337 X |
| 4,754,441 | 6/1988 | Butler | 310/337 X |
| 4,785,177 | 11/1988 | Besocke | 310/328 X |
| 4,868,446 | 9/1989 | Kumada | 310/369 X |
| 4,878,207 | 10/1989 | Jandera | 310/337 X |
| 4,949,316 | 8/1990 | Katahara | 310/337 X |
| 4,958,100 | 9/1990 | Crawley et al. | 310/328 |

Primary Examiner—Mark O. Budd
Attorney, Agent, or Firm—Gunn, Lee & Miller

[57] ABSTRACT

A transducer is constructed of a cylindrical shell and at least one pair of piezoelectric sections. Each member of the pair of piezoelectric sections is rigidly bonded to the wall of the cylinder, in a position diametrically opposed from the other member of the pair. Operation as an acoustic source transducer is accomplished by electrically energizing each piezoelectric section in such a manner as to cause the piezelectric sections to elongate and contract, respectively out of phase with one another, along the cylinder length. This causes flexural bending of the cylinder, with the bending being asymmetrical with respect to the cylinder axis. When one pair of piezoelectric sections is used in this manner, the transducer approximates an acoustic dipole radiator, and if more than one pair is used, the transducer can be used to approximate higher order polarized acoustic radiators. Various embodiments of the invention are particularly useful as either an acoustical source or detector in liquid-filled boreholes for geophysical application.

11 Claims, 4 Drawing Sheets

PIEZOELECTRIC CYLINDRICAL TRANSDUCER FOR PRODUCING OR DETECTING ASYMMETRICAL VIBRATIONS

BACKGROUND OF THE INVENTION

This invention relates to piezoelectric transducers, and more particularly to piezoelectric acoustic transducers used in boreholes in the earth for determining the acoustic parameters and other characteristics of surrounding geological formations.

RELATED ART

Different variations of electromechanical transducers operating on piezoelectric principles have been used for many years. Basically, the piezoelectric effect is an interrelationship between mechanical distortion and electrical effects, peculiar to certain crystalline materials. The nature and magnitude of a piezoelectric effect in a substance are dependent on the direction of applied force or electric field with respect to the crystallographic axes of the substance and its "polarization".

This polarization is one of several factors that determine the motion of a piezoelectric transducer, with other factors being the shape of the transducer, the manner in which the transducer is energized, and the manner in which two or more piezoelectric elements may be assembled to form a composite transducer.

One form of piezoelectric transducer is a bilaminar assembly of one piezoelectric plate rigidly bonded to either another piezoelectric plate or to a passive plate of similar dimensions to form a flexural "bender" transducer, planar in shape. Several transducers of this type are well known, including: (1) long rectangular plates that bend across their plane; (2) square plates in which the center moves relative to the four corners; and (3) circular plates in which the center moves relative to the peripheral edge. In general, these transducers are "bender" type transducers because their motion involves flexural bending of the composite assembly relative to the planar surfaces.

Other piezoelectric transducers are cylindrical in shape. In the past, cylindrical transducers have included a single cylindrical piezoelectric member, or alternatively a number of adjacent sections that move together as a cylinder. A cylindrical transducer can be polarized radially, i.e. through its thickness, or axially, i.e. along the length of its axis. Some cylindrical transducers combine both methods of polarization. Cylindrical transducers can be further classified according to whether the cylinder walls undergo uniform expansion and contraction, or whether the walls undergo flexural motion. In the latter case, the transducer is often referred to as a bender type transducer.

Piezoelectric cylindrical transducers that do not bend are disclosed in the following patents:

| U.S. Pat. No. | Inventor |
| --- | --- |
| 3,027,540 | G. Howatt |
| 3,177,382 | C. Green |
| 3,215,078 | C. Stec |
| 3,543,059 | W. Angeloff |
| 4,135,109 | Gingerich, et al. |
| 4,220,887 | H. Kompanek |
| 4,347,593 | W. Trott |
| Foreign Patent No. | |
| 2,650,256 (W. Germany) | R. Klot |

With regard to piezoelectric cylindrical bender transducers, two distinct flexural motions can be delineated: those that move symmetrically with respect to the cylinder axis and those that move asymmetrically.

A cylindrical bender transducer having axi-symmetrical motion is described in U.S. Pat. No. 4,525,645 issued to Shirley, et. al. The transducer is comprised of an outer cylinder and an inner cylinder, which are rigidly bonded together. At least one of the cylinders is made of piezoelectric ceramic material. The piezoelectric cylinder or cylinders are radially polarized, and voltage may be applied across their thickness. This applied voltage, together with the rigid bonding of the two cylinders, causes the cylinder walls to flex inward or outward, depending on the polarity of the voltage. If the transducer is capped at both ends, the flexing motion of the cylinder walls causes the ends of the cylinder to remain relatively stationary and the central part of the cylinder to expand or contract in diameter. The motion is described as symmetrical because the diameter of the cylinder in the central part between the ends either increases or decreases uniformly about the axis of the cylinder, the latter being stationary.

A different type of symmetrical bending is described in U.S. Pat. No. 3,845,333 issued to Holloway. This patent describes the various vibration modes of a piezoelectric cylindrical transducer, including a mode referred to as a "bending" mode, but which does not involve asymmetrical flexing of the cylinder walls.

Cylindrical bending transducers that have asymmetrical motion are described in U.S. Pat. No. 2,614,143 to Williams and U.S. Pat. No. 3,168,623 to Peterman. An important feature of both patents is that a single cylindrical piezoelectric element is used, with the bending being a function of electrode placement and applied voltages.

The objective of U.S. Pat. No. 2,614,143 is to produce a mechanical motion to move a shaft, such as might be used for a phonograph stylus transducer. Two cylindrical electrode sections are placed against a cylinder of piezoelectric material, whose base is fixed. The electrodes are oppositely energized to cause the cylinder to bend back and forth at its top, which causes a shaft affixed to the top to move.

U.S. Pat. No. 3,168,623 discloses a wide variety of transducer configurations for a number of applications. Although some of these configurations involve bending of the cylinder walls, like U.S. Pat. No. 2,614,143, a single cylindrical piezoelectric element is used and the cylinder is fixed at one end and the bending displacement is at the other.

None of the above patents describe a piezoelectric cylindrical transducer that exhibits asymmetrical bending motion in which the bending motion results from a rigid bonding of piezoelectric sections to a cylindrical shell, as well as from an independent electrical connection to each piezoelectric section. This configuration permits a unique type of bending motion, in which the walls of the cylinder exhibit the most bending at the center of the cylinder and the least bending at its ends. To the contrary, many of the bending type cylindrical transducers in the prior art are designed for motion only at one end. Additionally, none of the prior art transducers teach a means for controlling the plane of motion of the asymmetrical motions generated by the transducer.

Furthermore, in acoustic transducer applications, especially for producing vibrations in solids, such as for geophysical seismic applications, although some of the above inventions might be used to produce and detect compressional waves, none are useful for producing and detecting shear waves. Yet, in seismic applications, shear wave measurements have been recognized as a way to obtain valuable geophysical information. A problem with obtaining such measurements, however, has been finding satisfactory means for shear wave generation. Ideally, such sources should approximate an acoustic dipole radiator, which is not the case with prior art transducers. It would be difficult to use the transducers of the prior art to generate such waves, especially those that teach a fixed connection of one end of the transducer.

SUMMARY OF THE INVENTION

Accordingly, the primary object of the present invention is to provide a piezoelectric cylindrical transducer that produces asymmetrical vibrations, particularly, where bending of the cylinder walls causes them to move asymmetrically with respect to the cylinder axis.

Another object of the invention is to provide a transducer in which the plane of motion of waves generated by the transducer can be controlled and selected.

Another object of the invention is to provide a transducer that produces and detects shear waves in a surrounding solid medium.

Another object of the invention is to provide a transducer especially designed for borehole applications to measure shear wave characteristics of surrounding geological formations.

Another object of the invention is to provide a means for generating shear waves in boreholes that does not require the device to be clamped or physically attached to the borehole wall.

The foregoing objects are best achieved in a transducer having an outer cylindrical shell, with a plurality of conforming cylindrical segment piezoelectric sections attached to the inner surface of the shell in a rigidly bonded manner. The number of such sections is preferably a multiple of two, with one member of each pair attached to the cylindrical shell in a location diametrically opposed from the other member of the pair. In the simplest embodiment, only one such pair is present.

Operation as an acoustic source is accomplished by elongating and contracting the piezoelectric sections along their lengths, in an opposing manner, causing the cylindrical substrate to undergo asymmetrical flexural bending, which is characteristic of an acoustic dipole radiator. More complicated transducers can approximate higher order polarized radiators, such as a quadrupole radiator. Operation as an acoustic receiver is accomplished when acoustical signals cause the transducer to bend asymmetrically, which causes an electrical response in the piezoelectric sections.

DESCRIPTION OF THE PREFERRED EMBODIMENTS

A. Dipole embodiment with single plane of motion

Figure 1:
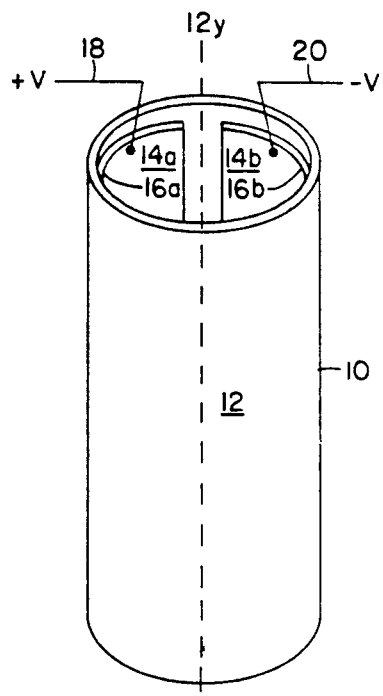
FIG. 1 is a perspective view of the simplest embodiment of the invention.
Figure 2:
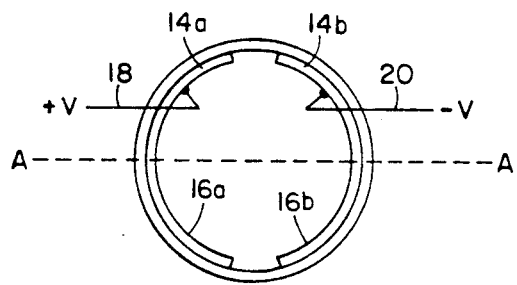
FIG. 2 is a top plan view of the invention.

In the most general terms, the invention is comprised of a hollow cylindrical shell, a plurality of piezoelectric sections, and electrical connections to each piezoelectric section. FIG. 1 shows the most simple embodiment of the invention, where the invention is shown as transducer 10. Transducer 10 is comprised of a cylindrical shell 12, one pair of piezoelectric sections 14a and 14b, and electrodes 16a and 16b. As will be explained below, this embodiment approximates a dipole acoustic source. FIG. 2 is a top plan view of transducer 10.

Piezoelectric sections 14a and 14b are made from piezoelectric materials, preferably a high temperature ceramic. In borehole geophysical applications, for example, cylindrical shell 10 may be made of metal such as stainless steel and piezoelectric sections 14a and 14b may be made of lead zirconate titanate. Piezoelectric sections 14a and 14b conform to the cylindrical curvature and are rigidly bonded to the inside surface of cylindrical shell 12. The bonding agent can be an epoxy adhesive or other suitable cement, which allows or provides electrical contact between cylindrical shell 12 and piezoelectric sections 14a and 14b at the bonding surface. The thickness and elastic properties of the bonding agent should not interfere with the bending of the transducer.

Piezoelectric sections 14a and 14b are diametrically opposed from each other and extend approximately the full length of cylindrical shell 12. Piezoelectric sections 14a and 14b are polarized or otherwise configured so that they will shorten or lengthen in the longitudinal direction when voltage is applied to them. In the preferred embodiment, piezoelectric sections 14a and 14b are bonded to the inside wall of cylindrical shell 12, although transducer 10 would operate in essentially the same manner if piezoelectric sections 14a and 14b were bonded to the outside wall.

Cylindrical shell 12 is metallic to permit voltage to be applied across the thickness of each piezoelectric section 14a and 14b, by means of electrodes 16a and 16b and wires 18 and 20 connected to piezoelectric sections 14a and 14b. It is possible that cylindrical shell 12 could be nonmetallic, but another means for applying voltage across the piezoelectric sections must be devised. Another advantage of using metal for the cylindrical shell 12 is electrical shielding and ruggedness. In borehole geophysical applications, cylindrical shell 12 is stainless steel, which has the advantages of good resistance to down-hole hydrostatic pressure, good resistance to corrosion caused by brine and other borehole fluids, good mechanical strength, and good electrical shielding of the piezoelectric sections. The diameter, length, wall thickness, and rigidity of cylindrical shell 12 all affect the operating frequency range and the sensitivity of transducer 10. The axis of cylindrical shell 12 is shown as axis 12y in FIG. 1.

The bending motion of transducer 10 is produced by applying a voltage V across the piezoelectric sections by means of wires 18 and 20 attached to inside surface electrodes 16a and 16b. Piezoelectric sections 14a and 14b may be oppositely polarized, in which case, to produce asymmetrical motions, the voltage applied to piezoelectric section 14a is the same polarity as the voltage applied to piezoelectric section 14b. Alternatively, piezoelectric sections 14a and 14b may have the same polarization, in which case the voltage applied to piezoelectric section 14a must be of opposite polarity from the voltage applied to piezoelectric section 14b to produce asymmetrical motions. This latter method of producing asymmetrical bending motion is shown in FIGS. 1 and 2.

In practical applications, transducer 10 may be surrounded by materials having a certain acoustical impedance. Preferably, this acoustical impedance will be matched or otherwise accommodated by the mechanical impedance of transducer 10 to provide efficient acoustic coupling of the transducer vibrations into the surrounding medium. Design choices can be made, such as the dimensions and materials used for cylindrical shell 12 and the dimensions of piezoelectric sections 14a and 14b, to control the natural resonance frequency of the transducer 10 and to control the mechanical impedance presented by transducer 10 to the surrounding medium.

Figure 3B:
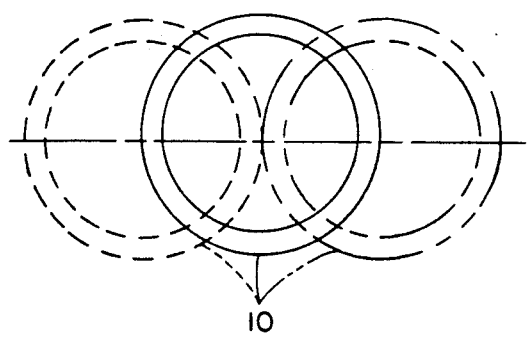
FIG. 3B is a cross-sectional view along the line 3B—3B of FIG. 3A, showing the bending of the invention during operation.
Figure 3A:
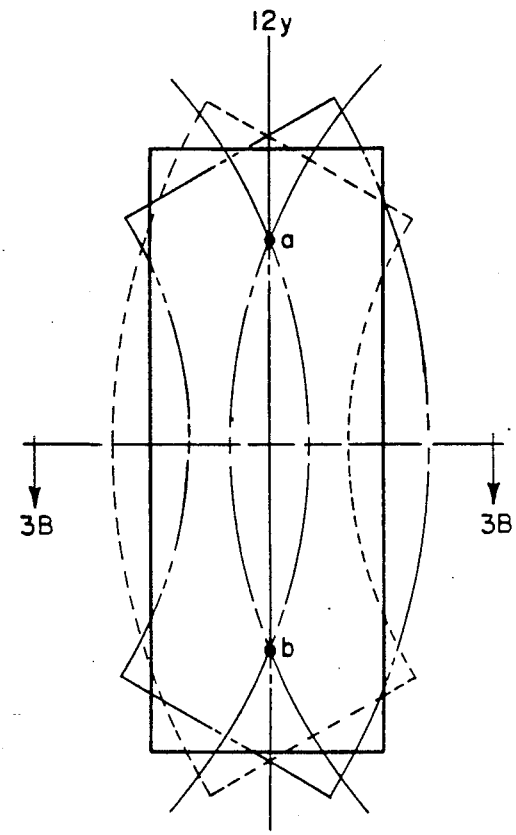
FIG. 3A illustrates the bending motion of the invention during operation.

FIG. 3A illustrates the motion of transducer 10 when electrically excited to produce asymmetrical vibration motions. The transducer is modeled as a free-body finite-length hollow cylinder and is viewed toward the plane of motion. The axis 12y of cylindrical shell 12 is undeflected in the rest, i.e. middle, position. To the left and right of the rest position, cylindrical shell 12 is shown in exaggerated asymmetrical deflection, from its rest position, to opposite extremes of transverse flexure. The axis 12y of cylindrical shell 12 bends with the transverse motions of cylindrical shell 12. The motion is in a plane from left to right that includes axis 12y. Two nodal points, a and b, are located on axis 12y at all deflection positions of cylindrical member 12. FIG. 3B shows the transverse deflection extremes that occur along section 3B—3B in FIG. 3A.

Applying the model of FIG. 3A and 3B to transducer 10 of FIG. 1, the electrical operation of transducer 10 as a source transducer may be described. One of the piezoelectric sections 14a or 14b is electrically excited to elongate, which causes the section of cylindrical shell 12, to which that piezoelectric section is bonded, to flex inward toward axis 12y. The other piezoelectric section 14a or 14b is simultaneously excited to contract, which causes the section of cylindrical shell 12, to which that piezoelectric section is bonded, to flex outward away from axis 12y. Combining these movements, cylindrical shell 12 is distorted to the range of curved shapes between the extremes shown in FIG. 3A. By continuously reversing the polarity of the voltages applied to piezoelectric sections 14a and 14b, the transducer will undergo oscillatory flexural motions in a plane that passes through axis 12y. Thus, the transducer 10 of FIG. 1, which has two diametrically opposed piezoelectric sections 14a and 14b, has a specific plane of flexural motion. This plane of motion is along a plane containing a line connecting the arc midpoints of piezoelectric sections 14a and 14b, as shown by line A—A of FIG. 2.

When the polarity of the applied voltages to piezoelectric sections 14a and 14b is alternated as described in the preceding paragraph, the bending motions of transducer 10 are analogous to the flexural motions of a vibrating string. That is, the axis 12y of the cylindrical shell 12 moves away from its straight vertical rest position to exhibit a curved shape in the plane of transverse vibrations. These transverse vibrations are "asymmetrical" because there is no geometrical axis of symmetry about which they occur.

Figure 3C:
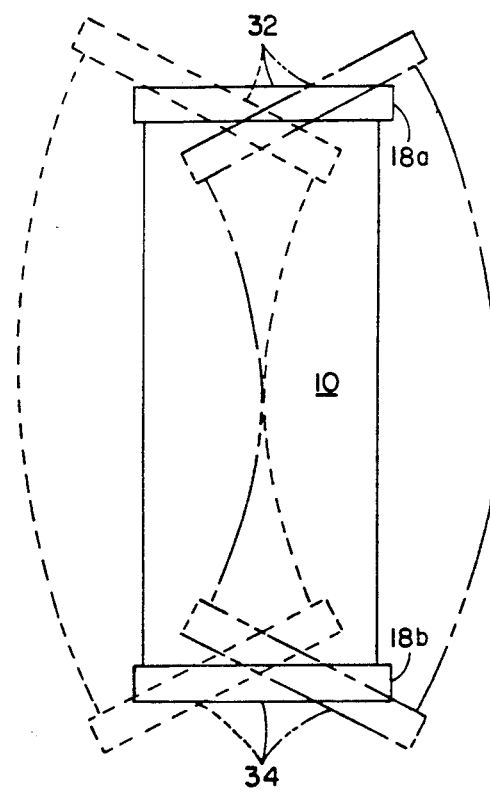
FIG. 3C is a side elevational view of the invention with end caps that constrain the motion shown in FIG. 3A.

FIG. 3C illustrates cylindrical member 12 with end caps 18a and 18b, which serve as inertial masses to constrain the motions illustrated in FIG. 3A. If end caps 18a and 18b are sufficiently massive in relation to cylindrical shell 12, they will serve as the nodal pivot points of the flexural vibrations. In such a configuration, transducer 10 is a fixed-length cylinder capable of bending in a specified plane of motion and having essentially fixed ends.

B. Dipole operation with control of the plane of motion

The plane of motion of the transducer 10 of FIGS. 1 and 2, which has two diametrically opposed piezoelectric sections 14a and 14b, is along one line A—A. By increasing the number of piezoelectric sections, the plane of motion can be varied and selectively controlled.

Figure 4:
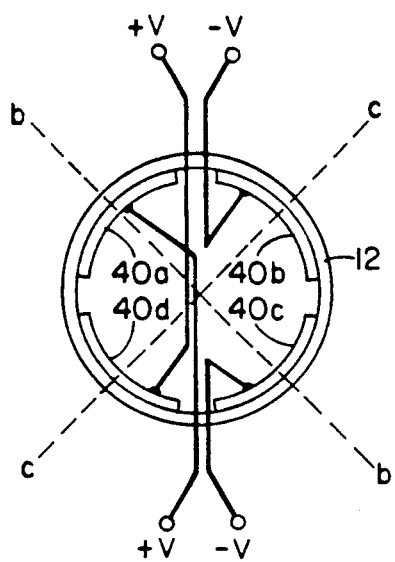
FIG. 4 is a top plan view of an alternative embodiment of the invention, which has four piezoelectric sections.

FIG. 4 shows an alternative embodiment of the piezoelectric sections of the invention, in cross sectional view. In this embodiment, there are four piezoelectric sections, 40a–40d, which comprise two pairs of diametrically opposed piezoelectric sections rather than one pair. As in the two-section embodiment of FIG. 1, each piezoelectric section 40a–40d extends slightly less than the length of cylindrical shell 12 and is rigidly bonded thereto. Similar to the embodiment of FIG. 1, each piezoelectric section 40a–40d is polarized so that it will extend or contract longitudinally. Another similarity is that the relative polarities of the piezoelectric sections 40a–40d determine the effect of the applied voltage.

The configuration of FIG. 4 permits the plane of motion to be excited in either one of two directions oriented at right angles to one another. Thus, a pair of piezoelectric sections, e.g., either 40a and 40c or 40b and 40d, is excited by applying the appropriate voltages to their electrodes in the same manner as was applied to the pairs of piezoelectric sections in the transducer of FIG. 1. The plane of motion is then either b—b or c—c. The exaggerated motions illustrated in FIG. 3A and FIG. 3B are descriptive of the motions in either planes b—b or c—c of the four-element configuration shown in FIG. 4 whenever element pairs 40a and 40c or 40b and 40d, respectively, are separately energized.

Figure 5:
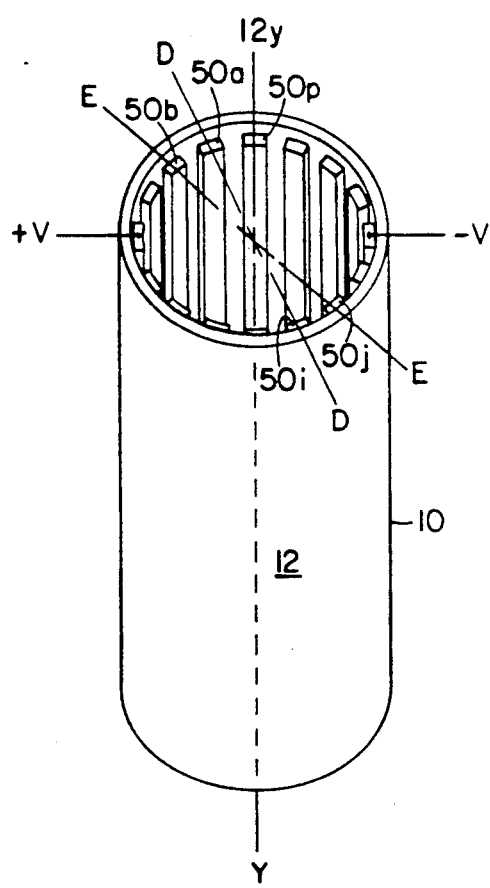
FIG. 5 is a perspective view of an alternative embodiment of the invention, which has sixteen piezoelectric sections.

FIG. 5 shows a third embodiment of the piezoelectric sections of the invention, in which there are sixteen piezoelectric sections, 50a-50p. These piezoelectric sections are in eight pairs, with the members of each pair being arranged in diametrically opposed positions. Again, the piezoelectric sections 50a-50p are cylindrical sections that are rigidly bonded to the inside surface of cylinder 12 and whose length is slightly less than that of cylindrical shell 12. Each piezoelectric section 50a or 50b is polarized so that it will extend or contract in the longitudinal direction, and again the relative polarization and the applied voltages determine how the cylindrical shell 12 will move. Thus, as in the embodiments of FIGS. 1 and 4, opposing pairs of piezoelectric elements 50a-50p may be electrically excited to produce asymmetrical bending. By selecting which pair to excite, the plane of motion may be selected.

The embodiments of FIG. 4 and FIG. 5 further permit the plane of motion to be rotated about axis 12y by switching the excitation voltage from one pair of diametrically opposing piezoelectric sections to an adjacent pair of piezoelectric sections. For example, referring to FIG. 5, if elements 50a and 50i are first excited, then elements 50b and 50j, the plane of motion D—D changes to plane E—E, in an azimuthal increment of 360/16=22.5 degrees about the cylinder axis 12y. For azimuthal control over the plane of motion, it is preferable that each piezoelectric section have the same polarization.

For each of the alternative embodiments shown in FIGS. 4 and 5, it is also possible to select and excite adjacent elements simultaneously. For example, the transducer of FIG. 4 can be operated in a mode similar to that of FIG. 1 if elements 40a and 40c are energized so that they will both flex in or out, and sections 40b and 40d are also energized together. As a further example, sectors consisting of several elements of the transducer of FIG. 5 could be simultaneously energized.

Although FIG. 4 and FIG. 5 show four and sixteen piezoelectric elements bonded to the surface of cylindrical shell 12, other embodiments of transducer 10 are possible using fewer or more piezoelectric elements. In general, for an even number N of equally spaced elements, the plane of motion can be selectively adjusted to N angular orientations having incremental azimuthal directions of 360/N degrees about the cylinder axis.

C. Multi-pole Operation

Figure 6:
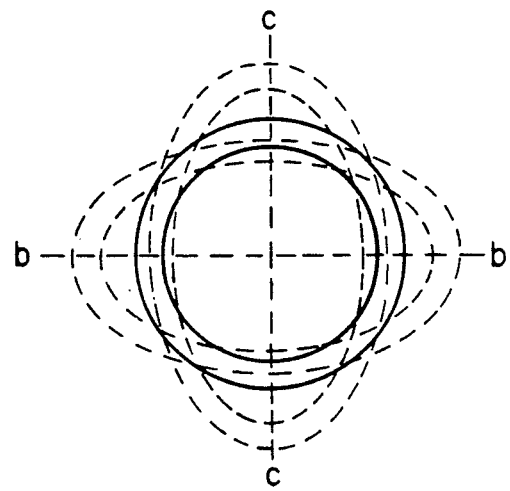
FIG. 6 is a cross sectional representation of the invention of FIG. 4 used to approximate a quadrupole acoustic source.

The embodiment of FIG. 4 can be made to approximate the motion of an acoustical quadrupole if simultaneous excitation voltages are applied to each diametrically opposite pair of elements 40a-40d. This motion is illustrated in cross-sectional view in FIG. 6.

Figure 7:
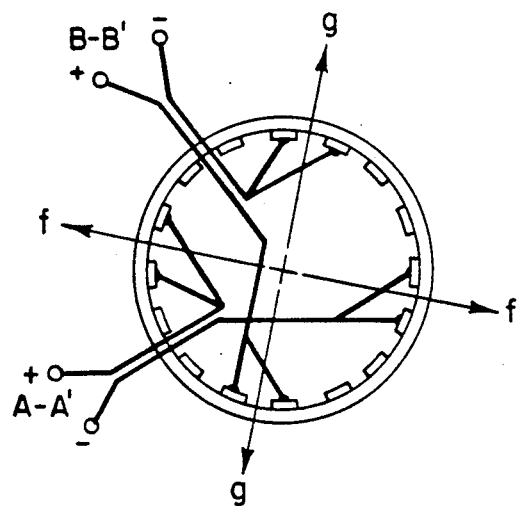
FIG. 7 is a top plan view of the invention of FIG. 5 used to approximate a quadrupole acoustic source.

The sixteen element transducer of FIG. 5 can be used to produce quadrupole motion by simultaneously energizing pairs of sections. For example, a configuration for producing quadrupole motion is illustrated in FIG. 7, where the planes of motion are along lines f—f and g—g.

More generally, the embodiment of FIG. 5 can be used as a multi-pole source having motions that can be azimuthally oriented in 360/16=22.5 degree increments about the cylinder axis. Furthermore, acoustic multipoles of higher order than quadrupoles can also be approximated by exciting three or more crossed pairs of piezoelectric sections. However, the effectiveness of such higher order multi-pole operation is limited by the Poisson coupling in the metal cylinder in the areas between the piezoelectric elements 40a-40p. This coupling tends to reduce the independent flexural vibrations of the cylinder necessary for multi-pole operation.

D. Asymmetrical vibration generation and detection

Although the above discussion has primarily been directed to the use of the transducer as a source of acoustical vibrations by means of electrical energization, each embodiment of the transducer may also be used as a receiver of acoustic vibrations. When used in this manner, acoustic signals that cause the transducer to vibrate asymmetrically cause an electrical response that is detected by electrodes 16a and 16b. The electrical signals thus generated may be used for various applications.

Thus, depending on whether the transducer is used to generate or to receive mechanical vibrations, the function of its electrical connections varies. In a broad sense, however, the electrical connection may be described as a means for generating or detecting a piezoelectric effect, depending on whether that effect is electrical to mechanical or vice versa. Thus, when generating vibrations, the electrical connections energize a mechanical piezoelectric effect. An advantage of the transducer of the present invention is that it permits reciprocal operation as either a source or a detector of transverse shear waves, although as discussed below, certain advantages may be obtained by different polarization of the piezoelectric elements, depending on whether the transducer is used as a source or detector.

In the most general terms, the invention is useful for the generation and detection of asymmetrical vibrations, without a particular limitation as to its application. Nevertheless, a particularly useful application of the invention is the generation and detection of shear waves in boreholes drilled in solids; an application for which other transducers have not been satisfactory.

Figure 8:
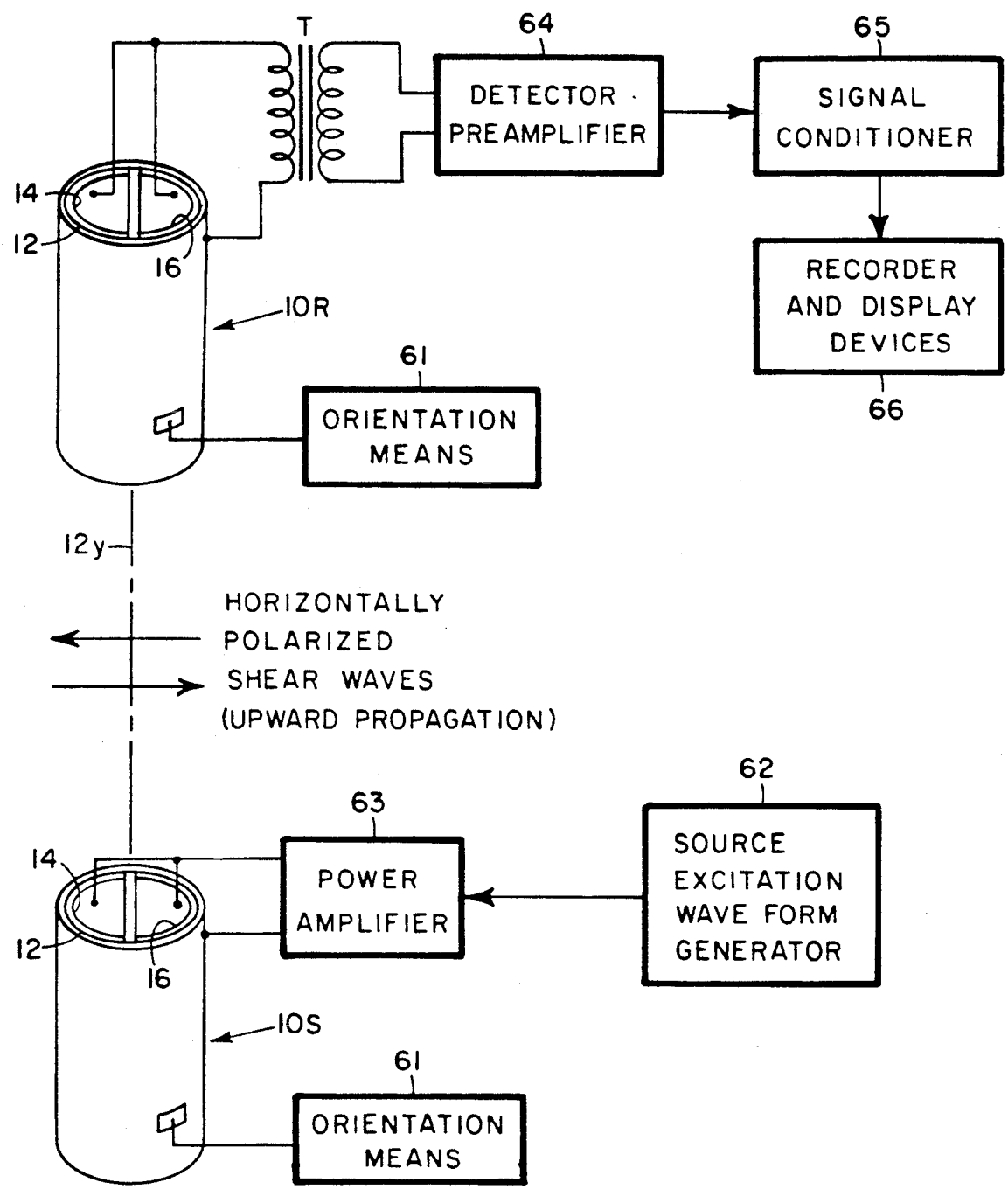
FIG. 8 is a schematic diagram depicting the supporting circuitry for the present invention as well as the relative orientation of the source and detector transducers when used to produce and detect shear waves in a surrounding medium.

As shown in FIG. 8, the invention may be used as a part of a system for measuring the effects of shear waves in the surrounding environment. Although FIG. 8 shows the embodiment of FIG. 1, the other embodiments may be used.

In FIG. 8, the source transducer is designated as source transducer 10S, and the receiver as receiver transducer 10R. In the example illustrated in FIG. 8, piezoelectric elements 14a and 14b comprising source transducer 10S are oppositely polarized as are piezoelectric elements 14a and 14b comprising receiving transducer 10R. Source transducer 10S is therefore caused to produce asymmetrical vibration motions by applying the same polarity source excitation signal to the piezoelectric sections 14a and 14b, as achieved by the parallel electrical connection of piezoelectric sections 14a and 14b with respect to cylindrical shell 12. Correspondingly, when dynamic forces on receiving transducer 10R cause asymmetrical bending motions, the piezoelectric sections 14a and 14b generate the same polarity of signal voltages with respect to cylindrical shell 12. Therefore, by connecting piezoelectric elements 14a and 14b in parallel, receiving transducer 10R will respond preferentially to asymmetrical force excitations and discriminate against axi-symmetrical excitation forces. The detected voltage response from transducer 10R is coupled through transformer T to the detector preamplifier 64 and signal conditioner 65 to be displayed and recorded by respective devices 66.

Both source transducer 10S and receiver transducer 10R are either rigidly oriented with respect to each other and have a common orientation means 61 to ensure that they stay properly oriented with respect to their surroundings, or, if not rigidly oriented with respect to each other, have individual orientation means 61 to ensure that they stay properly oriented with respect to each other and with respect to their surroundings. Orientation means 61 permit the shear wave radiation to be directed in a preferred direction and to be received in a known orientation. Orientation means 61 may incorporate a direction sensor, such as a magnetic compass or a gyroscope, which establishes a directional reference, and a rotating mechanism that adjusts the direction of the commonly aligned planes of the transducers relative to the directional reference. Commercial forms of suitable azimuthal orientation reference devices for borehole probe assemblies are manufactured by Humphrey, Inc., San Diego, Calif., and are designated as Directional Gyroscope Model DG69-0901-1 and Fluxgate Magnetic Northseeker Model NS21-0103-2. If both source transducer 10S and receiver transducer 10R are not rigidly oriented with respect to each other, each must have a separate direction sensor, and a separate rotating mechanism so as to independently be adjustable. Alternatively, the reference direction sensor may be used only to provide a readout so that the directional orientations of the shear wave polarization planes of source transducer 10S and receiver transducer 10R can be known and considered in the analysis and interpretation of the shear wave measurements.

Source transducer 10S receives amplified electrical signals from a waveform generator 62 via an amplifier 63. Generally, the signal from waveform generator 62 will be a sinusoidal signal whose frequency may be varied. An advantage of the present invention, however, is that it permits generation of controlled waveform source signals, such as continuous oscillatory waves, gated oscillatory pulses, sweep frequency oscillations, and transient impulses of prescribed waveforms.

The operation of source transducer 10S is simplified when the diametrically opposed pairs of piezoelectric sections 14a and 14b have opposite polarization. If this opposite polarization is used, the electrodes bonded to cylindrical shell 12 can be connected to circuit ground and the inner electrodes connected to the piezoelectric sections can be connected in parallel to permit a single-ended excitation drive. On the other hand, if the piezoelectric sections have the same polarization, the electrical excitation applied to the transducer must be a balanced drive with respect to cylindrical shell 12.

Receiver transducer 10R detects horizontally polarized shear waves that are generated by source transducer 10S and which propagate through whatever solid material is between the source and receiver transducers 10S and 10R. Receiver transducer 10R is electrically coupled to a preamplifier 64. The amplified signal is then conditioned by a signal conditioner 65 and delivered to a means for recording and displaying the signals 66. An operator then collects and interprets the results.

In one arrangement, the diametrically opposed pairs of piezoelectric sections 14a and 14b in receiver transducer 10R have opposite polarization and equal sensitivity to external excitation forces. This permits the diametrically opposed piezoelectric sections 14a and 14b to be connected in parallel to maximize the electrical charge in response to shear waves, while minimizing the effects of compressional waves.

In another arrangement in which the piezoelectric elements 14a and 14b in receiving transducer 10R have the same polarization and equal sensitivity to external excitation forces, the transducer 10R will exhibit preferential response to shear waves and will discriminate against compressional waves when a balanced circuit with respect to cylindrical shell 12 is used at the input to the detector preamplifier 64.

A further advantage of having the same polarization for the piezoelectric sections 14a and 14b of receiver transducer 10R occurs when the detector preamplifier 64 is susceptible to common mode interference. If this is the case, a balanced input amplifier can be used to reduce the interference and, at the same time, provide twice the voltage sensitivity of parallel-connected piezoelectric sections.

Figure 9:
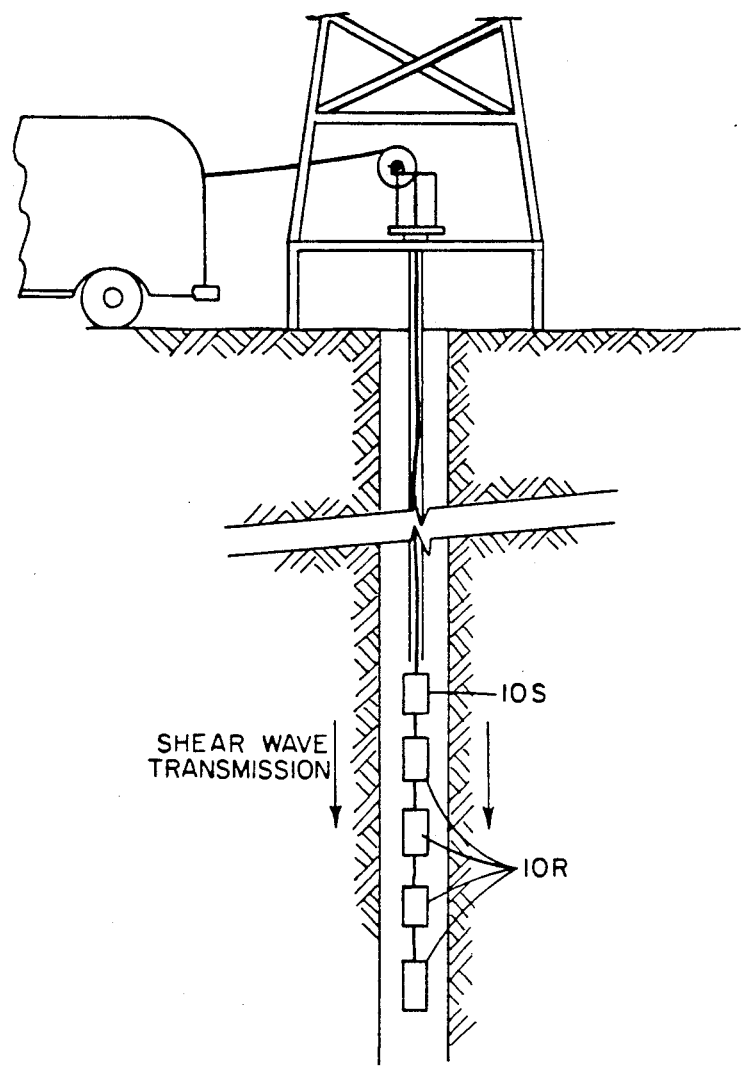
FIG. 9 is a cross-sectional elevation showing use of the invention in a single borehole.
Figure 10:
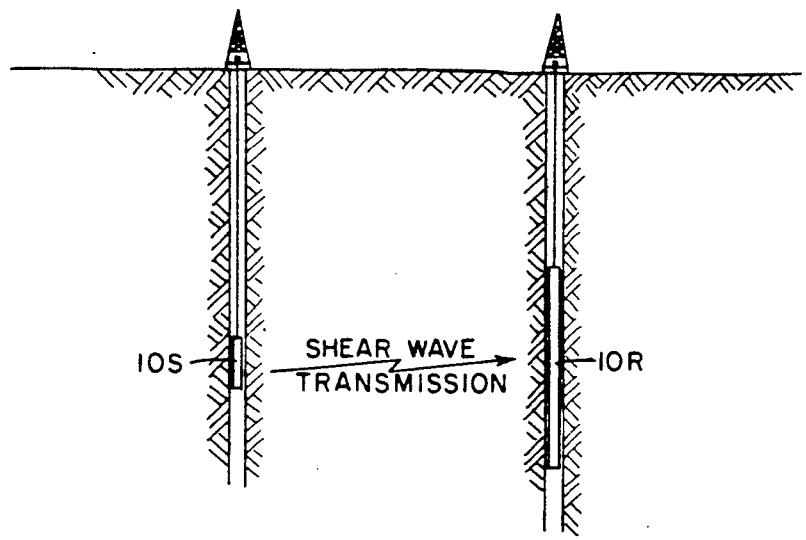
FIG. 10 is a cross-sectional elevation illustrating use of the invention in separate boreholes.

FIGS. 9 and 10 show the invention used as a shear wave source and detector in solid materials, such as in earth by being inserted into a borehole 90. This permits geophysical measurements related to the physical properties and structure of the drilled geological environment of one or more boreholes. Two general methods of using transducers for this purpose are for measurements in a single borehole as shown in FIG. 9 and measurements between two boreholes as shown in FIG. 10.

The transducers used in these applications may be any of the embodiments described above. The transducers are inserted into boreholes filled with water, drilling mud, or other borehole fluid. Because of the fluid coupling between the transducer and borehole wall, there is no need for the transducer to be clamped or otherwise physically attached to the borehole. In practical applications, the transducers may be housed in a downhole probe.

An important feature of the present invention is the generation and detection of shear waves. When a source transducer 10S is placed in a fluid-filled borehole and electrically excited to produce the flexural motion described above, the motion produces pressure waves in the fluid. These pressure waves are asymmetrical about the borehole axis, with increased pressure and a corresponding increment of force on the borehole wall in the direction in which the transducer moves outward away from the cylindrical axis. At the same time, there is decreased pressure and a negative increment of force on the diametrically opposite side of the borehole. The lateral force from the transducer vibrations on the borehole walls introduces transverse shear stresses in the borehole wall material and, hence, causes shear waves to be radiated into the solid environment. These lateral forces caused by the transducer vibrations on the borehole walls introduce transverse shear stresses in the surrounding geological formation and hence cause shear waves to be radiated into the solid environment. The shear waves generated by this process are polarized transverse to the borehole axis and have their maximum radiated amplitude in the direction perpendicualar to the plane of flexural motion.

The directed lateral force on the borehole wall, as produced by the asymmetrical cylindrical bender transducer, is equivalent to the force that would be produced by an idealized acoustic dipole radiator aligned in the plane of motion along the direction of the maximum asymmetrical force. In this connection, the force of the dipole point radiator would be from equal but opposite polarity pressure waves radiated in the forward and back direction of the dipole source.

For example, in a vertical borehole, the source transducer 10S will generate horizontally polarized shear waves that radiate in the direction perpendicular to the plane of the lateral force. At the receiving transducer, when a shear wave that is polarized transverse to the borehole is incident on the borehole, the shear wave motions cause an asymmetrical pressure wave in the borehole fluid, which in turn, will excite a detection response when the pressure wave gradient is aligned with the piezoelectric axis formed by diametrically opposite piezoelectric sections of the transducer. In sum, the systems of FIG. 9 and FIG. 10 both create shear waves polarized in a particular direction and detect shear waves polarized in a particular direction. For optimum transmission and reception of such waves, the shear wave polarization orientations of the source transducer 10S and receiver transducer 10R must be parallel, which can be accomplished with the orientation means shown in FIG. 8.

In FIG. 9, several units of the invention have been placed in a single borehole for acoustic well logging. A logging tool contains at least two transducers, each of which may be operated as either a source transducer or receiver transducer. During operation, at least one transducer is a source transducer 10S and one is a receiver transducer 10R, as in FIG. 8.

Elastic waves are generated at one location in the borehole, at source transducer 10S, and detected at another location in the same borehole, at receiver transducer 10R. The output of the receiver transducer 10R provides information about the elastic wave propagation characteristics of the rock formations between the source transducer 10S and the receiver transducer 10R. Information of this type, after correlation with previously measured and analyzed data from known rock types, can be interpreted to determine the downhole rock type, rock porosity, and elastic parameters. The borehole and source transducer 10S also causes interface waves along the borehole, which consist of elastic waves in the rock dynamically and physically coupled with compressional waves in the drilling mud or water in the borehole as a result of the borehole boundary. These interface waves give information on the shear wave propagation parameters as well as the pore fluid viscosity and the liquid permeability of the rock.

In FIG. 10, a plurality of units of the invention have been placed in two spaced boreholes. The source borehole contains at least one source transducer 10S. The receiver borehole typically contains several receiver transducers 10R, perhaps as many as eight or more. These receiver transducers are themselves contained either as part of or within a single borehole probe.

Elastic waves are generated and radiated from the source borehole and are detected at one or more locations in the receiver borehole. These waves can be analyzed to reveal the spatial distribution of certain rock properties, including the compressional and shear wave velocities, elastic parameters, and porosity in the tested zone between the boreholes. The use of shear waves in hole-to-hole applications can be used to provide information about the anisotropic characteristics of the surrounding rock.

Although the invention has been described with reference to specific embodiments, this description is not meant to be construed in a limiting sense. Various modifications of the disclosed embodiment, as well as alternative embodiments of the invention, will become apparent to persons skilled in the art upon reference to the description of the invention. It is therefore contemplated that the appended claims will cover such modifications that fall within the true scope of the invention.

I claim:

1. A system for generating shear waves and measuring compressional and shear wave characteristics in a solid medium, comprising:

a source transducer, having a cylindrical shell with an inside and an outside surface and having at least two piezoelectric sections, each of such sections being rigidly bonded to said cylindrical shell such that said cylindrical shell bends when said piezoelectric are electrically energized to produce vibrations that are asymmetrical to the axis of said transducer, a receiver transducer, having a cylindrical shell with an inside and an outside surface and having at least two piezoelectric sections, each of such sections being rigidly bonded to said cylindrical shell such that the piezoelectric sections generate an electrical response when said transducer is subjected to asymmetrical bending forces applied to said cylindrical shell, means for applying electrical signals as input to said source transducer, and means for detecting electrical signals as output from said receiver transducer.

2. The system of claim 1 further comprising orientation means for orienting said transducers to control the polarization direction of said asymmetrical vibrations, said orientation means comprising direction determining means and rotating means.

3. The system of claim 1 wherein said cylindrical members are metallic.

4. The system of claim 1 wherein said piezoelectric sections are arranged in at least two diametrically opposing pairs.

5. The system of claim 1 wherein the polarization of each member of said pair of said piezoelectric sections is opposite to the polarization of the other member.

6. The system of claim 1 wherein the polarization of each member of said pair of said piezoelectric sections is the same as the polarization of the other member.

7. The system of claim 1 wherein said means for applying and detecting electrical signals at said piezoelectric sections permits voltage differences to be independently applied or independently detected with respect to each of said piezoelectric sections.

8. The transducer of claim 7 wherein said means for applying and detecting electrical signals at said piezoelectric sections comprises an electrical connection of said cylindrical shell to a shell electrode and an electrical connection of said piezoelectric sections to a plurality of section electrodes, such that a voltage difference between said shell electrode and any of said section electrodes may be applied or detected.

9. The transducer of claim 1 further comprising an inertial mass cap on at least one end of said cylindrical shell, said cap having sufficient mass such that the motion of said transducer is constrained at that end of said transducer.

10. The transducer of claim 1 further comprising means for a plurality of planes of motion of said source transducer and a plurality of planes of motion sensitivity of said receiving transducer.

11. The transducer of claim 10 wherein said means for a plurality of planes of motion comprises at least four of said piezoelectric sections in two pairs, whose members are each diametrically opposed from one another.

* * * * *